United States Patent
Yoon et al.

(10) Patent No.: US 10,692,953 B2
(45) Date of Patent: Jun. 23, 2020

(54) DISPLAY APPARATUS

(71) Applicant: Samsung Display Co., Ltd., Yongin-si, Gyeonggi-do (KR)

(72) Inventors: Mijin Yoon, Yongin-si (KR); Cheolsu Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 64 days.

(21) Appl. No.: 15/589,706

(22) Filed: May 8, 2017

(65) Prior Publication Data

US 2018/0047802 A1 Feb. 15, 2018

(30) Foreign Application Priority Data

Aug. 12, 2016 (KR) .................. 10-2016-0103202

(51) Int. Cl.
*H01L 27/32* (2006.01)
*H01L 51/52* (2006.01)
*H01L 51/00* (2006.01)

(52) U.S. Cl.
CPC ...... *H01L 27/3276* (2013.01); *H01L 27/3262* (2013.01); *H01L 51/0097* (2013.01); *H01L 51/5253* (2013.01); *H01L 2251/5338* (2013.01)

(58) Field of Classification Search
CPC ............ H01L 51/0097; H01L 27/3276; H01L 2251/5338
See application file for complete search history.

(56) References Cited

U.S. PATENT DOCUMENTS

| | | | |
|---|---|---|---|
| 8,791,455 | B2 | 7/2014 | Kim et al. |
| 9,287,342 | B2* | 3/2016 | Kwon ................. H01L 27/3276 |
| 2014/0217397 | A1* | 8/2014 | Kwak ................. H01L 27/1218 |
| | | | 257/43 |
| 2014/0232956 | A1* | 8/2014 | Kwon ............... G02F 1/133305 |
| | | | 349/12 |
| 2016/0014883 | A1 | 1/2016 | Cho et al. |
| 2016/0027803 | A1 | 1/2016 | Park |
| 2017/0288005 | A1* | 10/2017 | Kawata ............... H01L 27/3276 |

FOREIGN PATENT DOCUMENTS

| | | |
|---|---|---|
| KR | 10-2014-0045193 | 4/2014 |
| KR | 10-2014-0108914 | 9/2014 |
| KR | 10-2014-0129647 | 11/2014 |
| KR | 10-2015-0020895 | 2/2015 |
| KR | 10-2015-0037159 | 4/2015 |
| KR | 10-2015-0074808 | 7/2015 |

* cited by examiner

*Primary Examiner* — Stephen M Bradley
(74) *Attorney, Agent, or Firm* — Innovation Counsel LLP

(57) ABSTRACT

A display apparatus includes: a substrate having a bending area between a first area and a second area; an inorganic insulating layer arranged on the substrate, the inorganic insulating layer having an opening or a groove corresponding to the bending area; a wiring unit extending to the second area through the bending area, the wiring unit arranged on the inorganic insulating layer and at least a portion thereof overlapping the opening or the groove; and an organic material layer between the inorganic insulating layer and the wiring unit, the organic material layer configured to fill the opening or the groove, wherein the wiring unit comprises a first wire and a second wire that are adjacent to each other, and a width in which the opening or the groove overlaps the first wire is different from the width in which the opening or the groove overlaps the second wire.

14 Claims, 16 Drawing Sheets

DISPLAY APPARATUS

CROSS-REFERENCE TO RELATED APPLICATION

This application claims the benefit of Korean Patent Application No. 10-2016-0103202, filed on Aug. 12, 2016, in the Korean Intellectual Property Office, the disclosure of which is incorporated herein in its entirety by reference.

BACKGROUND

1. Field

One or more embodiments relate to a display apparatus, and more particularly, to a display apparatus in which defects such as broken wiring are reduced.

2. Description of the Related Art

A display apparatus is an apparatus for displaying data visually. The display apparatus may include a substrate divided into a display area and a non-display area. In the display area, a gate line and a data line are electrically separated from each other, and intersections of the gate lines and the data lines may define a plurality of pixel areas in the display area. In addition, in the display area, a thin film transistor (TFT) and a pixel electrode electrically connected thereto may be arranged in correspondence with respective pixel areas. In the non-display area, various conductive layers, such as wires for transmitting electrical signals to the display area, may be arranged.

Visibility from various angles may be improved or an area of the non-display area may be reduced by bending a portion of the display apparatus. Methods have been presented to reduce defects that may occur during manufacturing of the above-described bent display apparatus and also to reduce manufacturing costs.

SUMMARY

Provided are a display apparatus in which defects such as broken wiring may be reduced and a method of manufacturing the same.

Additional aspects will be set forth in part in the description that follows and, in part, will be apparent from the description, or may be learned by practice of the presented embodiments.

One or more embodiments include a display apparatus including: a substrate having a bending area between a first area and a second area; an inorganic insulating layer arranged on the substrate, the inorganic insulating layer having an opening or a groove corresponding to the bending area; a wiring unit extending to the second area through the bending area, the wiring unit arranged on the inorganic insulating layer and at least a portion thereof overlapping the opening or the groove; and an organic material layer between the inorganic insulating layer and the wiring unit, the organic material layer configured to fill the opening or the groove, wherein the wiring unit comprises a first wire and a second wire that are adjacent to each other, and a width in which the opening or the groove overlaps the first wire is different from the width in which the opening or the groove overlaps the second wire.

According to an embodiment, a portion of edges of the opening or the groove may appear to have an uneven pattern, when viewed from above.

According to an embodiment, the uneven pattern may have a convex part and a concave part thereof arranged in a regular alternating order, the first wire may pass through the convex part, and the second wire may pass through the concave part adjacent to the convex part.

According to an embodiment, the organic material layer may appear to have a shape corresponding to the uneven pattern, when viewed from above.

According to an embodiment, the inorganic insulating layer may further include an additional opening or additional groove, around the opening or the groove, having a smaller area than the opening or the groove.

According to an embodiment, the additional opening or additional groove may be arranged in at least one of the first area and the second area.

According to an embodiment, an area of the opening or groove may be larger than that of the bending area.

According to an embodiment, the organic material layer may cover an inner surface of the opening or the groove and extend to a top surface of the inorganic insulating layer.

According to an embodiment, the organic material layer may include a concavo-convex surface on at least a portion of a top surface thereof.

One or more embodiments include a display apparatus including: a substrate having a bending area between a first area and a second area; an inorganic insulating layer arranged on the substrate, the inorganic insulating layer having an opening or a groove corresponding to the bending area; a wiring unit extending to the second area through the bending area, the wiring unit arranged on the inorganic insulating layer and at least a portion thereof overlapping the opening or the groove; and an organic material layer between the inorganic insulating layer and the wiring unit, the organic material layer configured to fill the opening or the groove, wherein the wiring unit comprises a first wire and a second wire that are adjacent to each other, and a height of a portion of the first wire on the organic material layer from a top surface of the substrate is different from a height of a portion of the second wire on the organic material layer from the top surface of the substrate.

According to an embodiment, the inorganic insulating layer may include a buffer layer, a gate insulating layer, and an interlayer insulating layer; the buffer layer, the gate insulating layer, the interlayer insulating layer, and an organic material layer may be sequentially laminated under a portion of the first wire; and the buffer layer and the organic material layer may be sequentially laminated under a portion of the second wire.

According to an embodiment, portions of the first and second wires may be arranged in a boundary area in which a top surface of the inorganic insulating layer and a top surface of the organic material layer meet each other.

According to an embodiment, a display apparatus may further include a thin film transistor arranged in the first or second areas and including a source electrode, a drain electrode, and a gate electrode, wherein the first and second wires include a same material as that of the source electrode and the drain electrode.

According to an embodiment, a display apparatus may further include a stress neutralization layer above the wiring unit.

One or more embodiments include a display apparatus including: a substrate having a bending area between a first area and a second area; an inorganic insulating layer on the substrate, the inorganic insulating layer having an opening or a groove corresponding to the bending area; a wiring unit extending to the second area through the bending area, the wiring unit arranged on the inorganic insulating layer and at least a portion thereof overlapping the opening or the groove; and an organic material layer between the inorganic insulating layer and the wiring unit, the organic material layer configured to fill the opening or the groove, wherein a portion of edges of the opening or the groove includes a concavo-convex surface including a convex part and a concave part, the wiring unit includes a first wire and a second wire that are adjacent to each other, and a plurality of convex parts or concave parts are arranged between the first wire and the second wire.

According to an embodiment, the first and second wires may pass through the convex part.

According to an embodiment, the organic material layer may cover an inner surface of the opening or the groove and extend to a top surface of the inorganic insulating layer.

According to an embodiment, an area of the opening or groove may be larger than that of the bending area.

According to an embodiment, a display apparatus may further include a conductive layer arranged on a layer different from a layer on which the first wire is arranged in the first area or the second area, and being electrically connected to the first wire.

According to an embodiment, a display apparatus may further include a thin film transistor arranged in the first or second areas and including a source electrode, a drain electrode, and a gate electrode, wherein the first wire is arranged on a same layer as the source electrode and the drain electrode, and the conductive layer is arranged on the same layer as the gate electrode.

BRIEF DESCRIPTION OF THE DRAWINGS

These and/or other aspects will become apparent and more readily appreciated from the following description of the embodiments, taken in conjunction with the accompanying drawings in which:

FIG. 6AA is a cross-sectional view of FIG. 6A, taken along a line II-II';

FIG. 6BB is a cross-sectional view of FIG. 6B, taken along a line IV-IV';

DETAILED DESCRIPTION OF THE EMBODIMENTS

Figure 1:
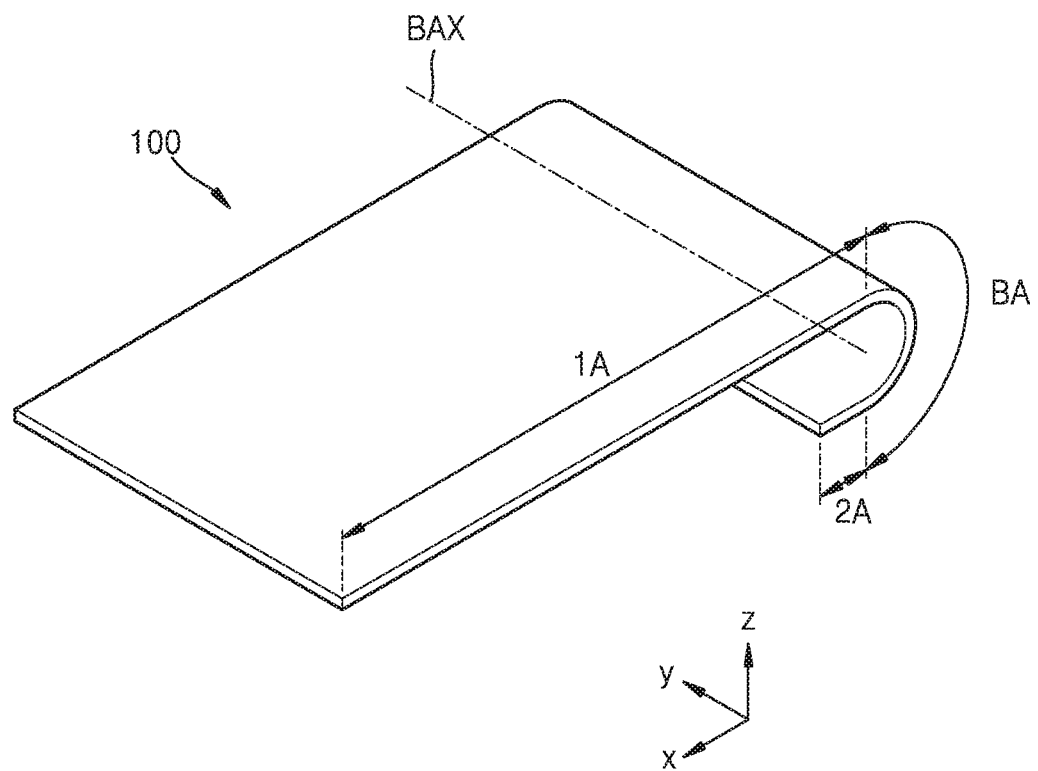
FIG. 1 is a perspective view of a portion of a display apparatus according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

As the present disclosure allows for various changes and numerous embodiments, embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

The present disclosure will now be described more fully with reference to the accompanying drawings, in which embodiments of the present disclosure are shown. Like reference numerals in the drawings denote like elements, and thus their repetitive description will be omitted.

While terms such as "first," "second," etc., may be used to describe various components, the components are not be limited to the above terms. The above terms are used only to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, it will be understood that when a layer, region, or component is referred to as being "connected to" another layer, region, or component, the layer, region, or component may be directly connected to the other layer, region, or component, or indirectly connected to the other layer, region, or component with an intervening layer, region, or component arranged therebetween. For example, when the layer, region, component is electrically connected to another layer, region, or component in the present disclosure, the layer, region, or component may be directly electrically connected to the other layer, region, or component, or indirectly connected to the other layer, region, or component with intervening layers, regions, or components arranged therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

A display apparatus is an apparatus configured to display an image, and may include a liquid crystal display, an electrophoretic display, an organic light-emitting display, an inorganic light-emitting display, a field emission display, a surface-conduction electron-emitter display, a plasma display, a cathode ray display, etc.

Below, a display apparatus according to one or more embodiments will be described with the organic light-emitting display as an example. However, a display apparatus according to the present disclosure is not limited thereto, and various other display apparatuses may be used.

Figure 2:
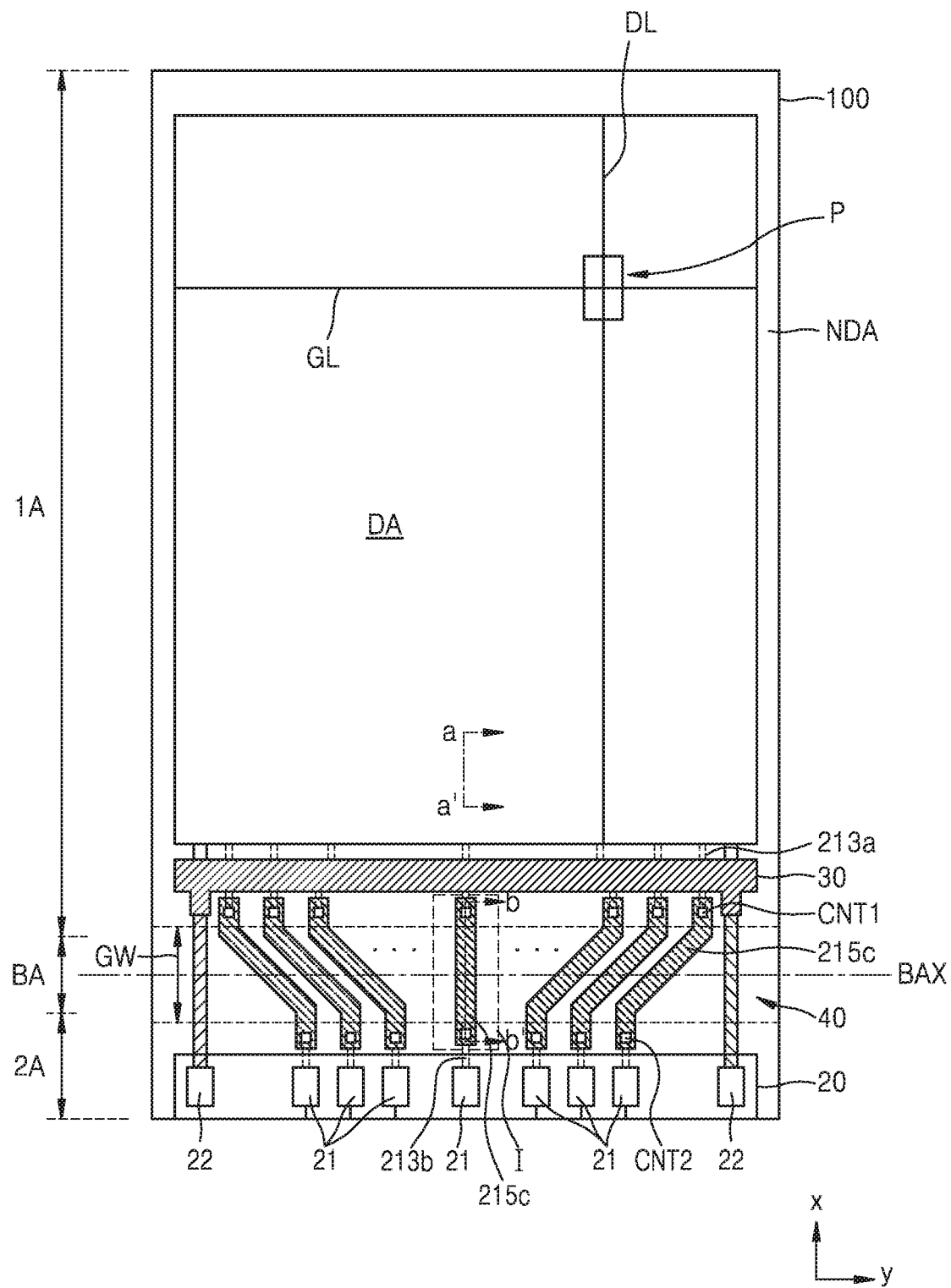
FIG. 2 is a cross-sectional view of the portion of the display apparatus of FIG. 1.
Figure 3:
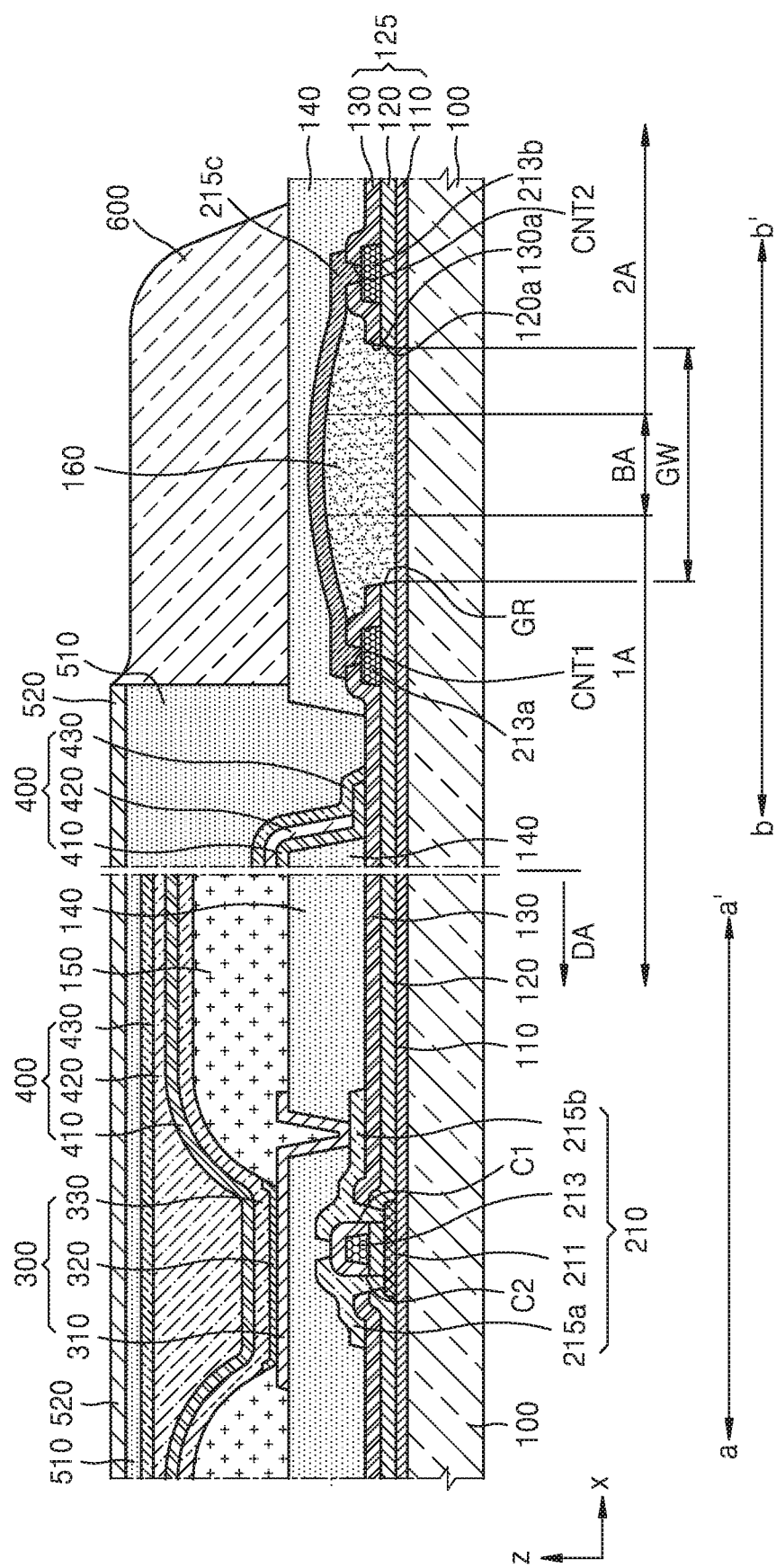
FIG. 3 illustrates portions of cross-sectional views of the display apparatus of FIG. 2, taken along lines a-a' and b-b'.
Figure 4:
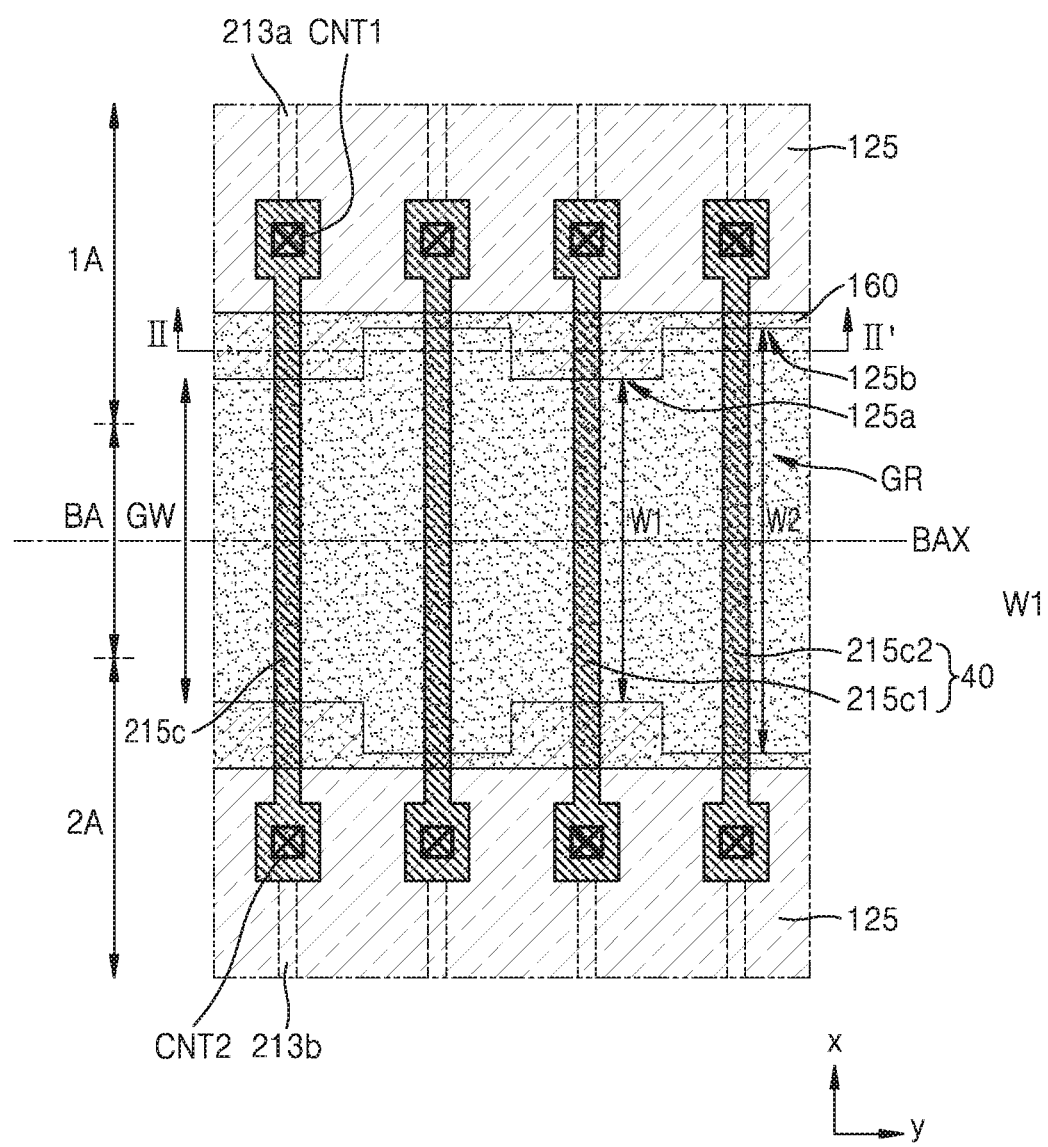
FIG. 4 is an enlarged plan view of a section I in FIG. 2.

FIG. 1 is a perspective view of a portion of a display apparatus according to one or more embodiments. FIG. 2 is a cross-sectional view of the portion of the display apparatus of FIG. 1, and FIG. 3 illustrates portions of cross-sectional views of the display apparatus of FIG. 2, taken along lines a-a' and b-b'. FIG. 4 is an enlarged plan view of a section I in FIG. 2.

According to an embodiment, since a portion of a substrate 100, that is, a portion of the display apparatus, is bent as illustrated in FIG. 1, a portion of the display apparatus may have a bent shape as the substrate 100. However, the display apparatus is illustrated in an un-bent state in FIGS. 2 and 3 for the sake of illustrative convenience. For reference, the display apparatus will be shown in the un-bent state for the sake of illustrative convenience in cross-sectional views and plan views of embodiments to be described below.

As illustrated in FIGS. 1 through 3, the substrate 100 included in the display apparatus may have a bending area BA, which extends in a first direction (+y direction) according to an embodiment. The bending area BA may be between a first area 1A and a second area 2A in a second direction (+x direction) crossing the first direction. For example, the substrate 100 may be bent around a bending axis BAX, which extends in the first direction (+y direction), as a center bending axis, as illustrated in FIG. 1. In FIG. 1, the substrate 100 is illustrated as being bent around the bending axis BAX with a uniform radius of curvature. However, the embodiment is not limited thereto. The substrate 100 may be bent around the bending axis BAX with non-uniform radii of curvature. The substrate 100 may include various materials having flexible or bendable characteristics, and may include, for example, polymer resins such as polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), and cellulose acetate propionate (CAP). The substrate 100 may have a single-layer or multi-layer structure formed of the material, and may further include an inorganic material layer in the case of the multi-layer structure.

The first area 1A may include a display area DA. The first area 1A may include a portion of a non-display area NDA outside the display area DA in addition to the display area DA, as illustrated in FIG. 2. The second area 2A may also include a portion of the non-display area NDA.

A plurality of pixels P may be arranged for displaying an image in the display area DA of the substrate 100. Elements such as a thin film transistor (TFT), an organic light-emitting diode (OLED), and a capacitor (Cst) may be arranged in the display area DA.

The display area DA may further include signal lines such as a gate line GL transmitting a gate signal, a data line DL transmitting a data signal, a driving power line transmitting power, and a common power line, and each of the pixels P may be formed for displaying the image by an electrical combination of the TFT, the Cst, the OLED, etc., which are connected to the gate line GL, the data line DL, and the driving power line. Each pixel P may emit light in response to the data signal and at a brightness corresponding to a driving current passing through the OLED according to a driving power supplied to the pixel P and the common power. The signal lines may be connected to a controller (not shown), which may be connected to a terminal unit 20, via a wire 215c in the non-display area NDA. The plurality of pixels P may be arranged in various shapes, such as a stripe array and a PenTile array. The display apparatus may further include an encapsulation member encapsulating the display area DA from the outside air.

In the non-display area NDA, a terminal unit 20, a driving power line 30, and a wiring unit 40 may be arranged. In addition, even though not shown, a common power line, a gate driver, a data driver, etc., may be further arranged in the non-display area NDA.

The terminal unit 20 may be arranged at one end of the non-display area NDA and include a plurality of terminals 21 and 22. The terminal unit 20 may not be covered by an insulating layer but may be exposed, and may be electrically connected to a controller (not shown), such as a flexible printed circuit board (PCB) and a driver integrated circuit (IC). The controller may provide the data signal, the gate signal, a driving voltage (ELVDD), a common voltage (ELVSS), etc.

The driving power line 30 may be connected to the controller via the terminal 22 and provide the driving voltage ELVDD supplied by the controller to the pixels P. The driving power line 30 may be arranged in the non-display area NDA and cover one side surface of the display area DA. In this case, wires 215c supplying the data or gate signals to the display area DA may be formed to cross the driving power line 30. In this case, the wires 215c may be connected to wires on other layers via contact holes.

The wiring unit 40 may include at least one wire 215c. The wiring unit 40 may overlap the bending area BA. In this case, the wire 215c may extend from the first area 1A to the second area 2A through the bending area BA. The wire 215c of the wiring unit 40 may extend over and cross the bending axis BAX. For example, the wire 215c may extend in a direction perpendicular to the bending axis BAX, but is not limited thereto. The wire 215c may have various other modifications, such as extending in a non-perpendicular direction with respect to the bending axis BAX and at a certain angle. In addition, the wire 215c may have various shapes, such as a curved shape and a zigzag shape. According to some embodiments, the wire 215c may not have a linear shape.

FIG. 3 illustrates that a display device 300 includes an organic light-emitting device (OLED) in the display area DA. When the OLED is electrically connected to a TFT 210, the pixel electrode 310 may be electrically connected to the TFT 210. A TFT (not shown) may be arranged in a peripheral area outside the display area DA of the substrate 100 in some cases. The TFT arranged in the peripheral area may be, for example, a portion of a circuit unit to control an electrical signal applied to the display area DA.

The TFT 210 may include a semiconductor layer 211, a gate electrode 213, a source electrode 215a, and a drain electrode 215b, which include amorphous silicon, polycrystalline silicon, or oxide semiconductor or organic semiconductor materials.

The gate electrode 213 may be connected to a gate wire (not shown), which provides an on/off signal to the TFT 210, and may include a low-resistance metal material. For example, the gate electrode 213 may be a single-layer or a multi-layer consisting of conductive materials including molybdenum (Mo), aluminum (Al), copper (Cu) and/or titanium (Ti), etc.

The source electrode 215a and the drain electrode 215b may include a single-layer or multi-layer of high conductivity, and be respectively connected to a source area and a drain area of the semiconductor layer 211. For example, the source electrode 215a and the drain electrode 215b may include a single-layer or multi-layer consisting of conductive materials including Al, Cu and/or Ti, etc.

The source electrode 215a and the drain electrode 215b may be connected to the semiconductor layer 211 via contact holes C1 and C2. The contact holes C1 and C2 may be formed by etching simultaneously an interlayer insulating layer 130 and a gate insulating layer 120.

The TFT 210 according to an embodiment may have a top gate type in which the gate electrode 213 is arranged above the semiconductor layer 211, but the embodiment is not limited thereto. The TFT 210 according to another embodiment may have a bottom gate type in which the gate electrode 213 is arranged under the semiconductor layer 211.

A gate insulating layer 120 may be between the semiconductor layer 211 and the gate electrode 213. The gate insulating layer 120 may include inorganic materials, such as silicon oxide, silicon nitride, and/or silicon oxynitride, for securing insulation between the semiconductor layer 211 and the gate electrode 213. In addition, an interlayer insulating layer 130 including inorganic materials, such as silicon oxide, silicon nitride, and/or silicon oxynitride, may be arranged on the gate electrode 213, and the source electrode 215a and the drain electrode 215b may be arranged on the interlayer insulating layer 130. Insulating layers including inorganic materials may be formed via chemical vapor deposition (CVD) or atomic layer deposition (ALD). This forming method is also applied to embodiments and various modifications thereof to be described below.

A buffer layer 110 including inorganic materials, such as silicon oxide, silicon nitride, and/or silicon oxynitride, may be arranged between the TFT 210 and the substrate 100 in the above-described structure. The buffer layer 110 may increase the flatness of a top surface of the substrate 100, or prevent or reduce infiltration of impurities from the substrate 100, etc., to the semiconductor layer 211 of the TFT 210. The buffer layer 110 may include inorganic materials, such as oxides and nitrides, or organic materials, or a combination thereof, and have a single-layer or multi-layer structure. According to another embodiment, the buffer layer 110 may have a triple-layer structure consisting of silicon oxide/silicon nitride/silicon oxynitride.

A planarization layer 140 may be arranged on the TFT 210. For example, when the OLED is arranged over the TFT 210, as illustrated in FIG. 3, the planarization layer 140 may serve to planarize a top surface of a protection layer covering the TFT 210. The planarization layer 140 may include, for example, organic materials, such as acryl, benzocyclobutene (BCB), and hexamethyldisiloxane (HMDSO). The planarization layer 140 is illustrated as a single layer in FIG. 3; however, the planarization layer 140 may be variously modified. For example, the planarization layer 140 may have a multi-layer structure. In addition, the planarization layer 140 may include an opening outside the display area DA, as illustrated in FIG. 3, so that a portion of the planarization layer 140 in the display area DA and a portion of the planarization layer 140 in the second area 2A may be physically separate from each other. Such arrangement prevents impurities that have infiltrated from the outside from reaching the inside of the display area DA through the planarization layer 140.

The OLED including the pixel electrode 310, a counter electrode 330, and an intermediate layer 320 provided therebetween and including a light-emitting layer may be arranged on the planarization layer 140 and in the display area DA of the substrate 100. The pixel electrode 310 may contact any one of the source electrode 215a and the drain electrode 215b via an opening formed in the planarization layer 140, etc., and be electrically connected to the TFT 210, as illustrated in FIG. 3.

A pixel definition layer 150 may be arranged on the planarization layer 140. The pixel definition layer 150 may define a pixel by having an opening corresponding to respective sub-pixels, that is, an opening to allow at least a central portion of the pixel electrode 310 to be exposed. In addition, as illustrated in FIG. 3, the pixel definition layer 150 may prevent an occurrence of an arc, etc., on edges of the pixel electrode 310 by increasing a distance between edges of the pixel electrode 310 and the counter electrode 330 above the pixel electrode 310. The pixel definition layer 150 may include, for example, organic materials, such as PI and HMDSO.

The intermediate layer 320 of the OLED may include low molecular weight materials or polymer materials. When the intermediate layer 320 includes low molecular weight materials, a hole injection layer (HIL), a hole transport layer (HTL), an emission layer (EML), an electron transport layer (ETL), an electron injection layer (EIL), etc., may have laminated structures with a single layer or multiple layers, and include various organic materials, such as copper phthalocyanine (CuPc), N,N'-Di(naphthalene-1-yl)-N,N'-diphenyl-benzidine (NPB), and tris(8-hydroxyquinoline) aluminum (Alq3). The above-described layers may be formed via a vacuum deposition method.

When the intermediate layer 320 includes polymer materials, the intermediate layer 320 may have a structure that generally includes an HTL and an EML. In this case, the HTL may include poly 3,4-ethylenedioxythiophene (PEDOT), and the light-emitting layer may include high molecular (polymer) materials, such as poly-phenylenevinylene (PPV) and polyfluorene. The intermediate layer 320 may be formed via screen printing, inkjet printing, laser induced thermal imaging (LITI), etc.

However, the intermediate layer 320 is not limited thereto and may have various other structures. In addition, the intermediate layer 320 may include an integrated layer covering a plurality of pixel electrodes 310 and include a patterned layer corresponding to each of the plurality of pixel electrodes 310.

The counter electrode 330 may be arranged on a top portion of the display area DA and cover the display area DA, as illustrated in FIG. 3. In other words, the counter electrode 330 may have an integrated structure including a plurality of OLEDs and thus, may correspond to the plurality of pixel electrodes 310.

Since the OLED may be damaged by humidity, oxygen, etc., from the outside, an encapsulation layer 400 may protect the OLEDs by encapsulating the OLEDs. The encapsulation layer 400 may cover the display area DA and extend to the outside of the display area DA. The encapsulation layer 400 may include a first inorganic encapsulation layer 410, an organic encapsulation layer 420, and a second inorganic encapsulation layer 430, as illustrated in FIG. 3.

The first inorganic encapsulation layer 410 may cover the counter electrode 330, and include silicon oxide, silicon nitride, and/or silicon oxynitride, etc. Other layers, such as a capping layer, may be arranged between the first inorganic encapsulation layer 410 and the counter electrode 330 in some cases. Since the first inorganic encapsulation layer 410 is formed according to a structure thereunder, a top surface of the first inorganic encapsulation layer 410 may not be flat, as illustrated in FIG. 3. The organic encapsulation layer 420 may cover the first inorganic encapsulation layer 410, and a top surface thereof may be generally smooth, unlike the first inorganic encapsulation layer 410. In detail, the top surface of the organic encapsulation layer 420 may be approximately flat in an area corresponding to the display area DA. The organic encapsulation layer 420 may include at least one material selected from PET, PEN, PC, PI, polyethylene sulfonate (PES), polyoxymethylene (POM), polyallylate, and hexadimethyl siloxane (PDMS). The second inorganic encapsulation layer 430 may cover the organic encapsulation layer 420, and include silicon oxide, silicon nitride, and/or silicon oxynitride, etc. The second inorganic encapsulation layer 430 may prevent the organic encapsulation layer 420 from being exposed to the outside by covering and/or contacting the first inorganic encapsulation layer 410 at an edge arranged outside the display area DA.

Since the encapsulation layer 400 includes the first inorganic encapsulation layer 410, the organic encapsulation layer 420, and the second encapsulation layer 430, even when a crack occurs in the encapsulation layer 400, the crack may not be connected between the first inorganic encapsulation layer 410 and the organic encapsulation layer 420 or between the organic encapsulation layer 420 and the second encapsulation layer 430 due to the above-described multi-layer structure. Thus, the formation of an infiltration route of humidity or oxygen from the outside to the display area DA may be prevented or reduced through the above-described structure.

According to an embodiment, the display apparatus may include a polarizing plate 520 disposed above an encapsulating layer 400 with an optically clear adhesive (OCA) 510 disposed therebetween. The polarizing plate 520 may reduce a reflection of outside light. For example, when the outside light transmitted through the polarizing plate 520 is reflected on a top surface of the counter electrode 330 and passes through the polarizing plate 520 again, a phase of the outside light may be changed due to passing through the polarizing plate 520 two times. As a result, the phase of the reflected light may become different from that of the outside light entering the polarizing plate 520 and annihilation interference may occur; thus, the reflection of the outside light may be reduced, and a visibility may be improved. The OCA 510 and the polarizing plate 520 may cover, for example, the opening of the planarization layer 140, as illustrated in FIG. 3. However, the display apparatus according to an embodiment may not necessarily include the polarizing plate 520 all the time, and the polarizing plate 520 may be omitted or replaced by other components in some cases. For example, the outside reflection may be reduced by omitting the polarizing plate 520 and using a black matrix and a color filter.

The buffer layer 110, the gate insulating layer 120, and the interlayer insulating layer 130, which include inorganic materials, may be collectively referred to as an inorganic insulating layer 125. The inorganic insulating layer 125 may include a groove GR corresponding to the bending area BA as illustrated in FIG. 3. The groove GR may be understood as an area in which a portion of the inorganic insulating layer 125 has been removed in a downward direction (−z direction) and another portion thereof remains. For example, the buffer layer 110 may be continuous throughout the first area 1A, the bending area BA, and the second area 2A. In addition, the gate insulating layer 120 may include an opening 120a corresponding to the bending area BA, and the interlayer insulating layer 130 may include an opening 130a also corresponding to the bending area BA. Accordingly, it will be understood that the inorganic insulating layer 125 including the buffer layer 110, the gate insulating layer 120, and the interlayer insulating layer 130 may have the groove GR corresponding to the bending area BA. The inorganic insulating layer 125 may include the groove GR in various shapes different from the above-described shape. For example, various other modifications may be possible such that a portion of a top surface of the buffer layer 110 (+z direction) may be removed, and/or a bottom surface of the gate insulating layer 120 (−z direction) may not be removed but remain.

When the groove GR corresponds to the bending area BA, the groove GR may overlap the bending area BA. In this case, an area of the groove GR may be larger than that of the bending area BA. To show this effect, a groove width GW is illustrated as greater than the width of the bending area BA in FIG. 3. Here, the area of the groove GR may be defined as an area of an opening with the smallest area among openings of the gate insulating layer 120 and the interlayer insulating layer 130.

In the display apparatus according to an embodiment, an organic material layer 160 may fill at least a portion of the groove GR. In other words, the organic material layer 160 may overlap the bending area BA. The organic material layer 160 may extend to a portion of a non-bending area.

In addition, the display apparatus may include the wire 215c according to an embodiment. The wire 215c may extend from the first area 1A to the second area 2A through the bending area BA, and be arranged on the organic material layer 160. The wire 215c may be arranged on and directly contact the inorganic insulating layer 125, such as the interlayer insulating layer 130, where the organic material layer 160 does not exist. The wire 215c may serve to transmit electrical signals to the display area DA, and be simultaneously formed with the source electrode 215a or the drain electrode 215b, with the same material thereof.

As described above, the display apparatus is illustrated as un-bent in FIG. 3 for the sake of convenience. However, the substrate 100, etc., of the display apparatus according to an embodiment may actually be in a bent state in the bending area BA, as illustrated in FIG. 1. The substrate 100 of the display apparatus may be manufactured in a generally smooth state, as illustrated in FIG. 3, in a manufacturing process, and thereafter, the substrate 100, etc., may be bent in the bending area BA so that the display apparatus approximately has in a shape as illustrated in FIG. 1. In this case, the wire 215c may receive tension stress in a bending process of the substrate 100, etc., in the bending area BA. However, an occurrence of defects in the wire 215c during the bending process may be prevented or reduced in the display apparatus according to the present embodiment.

When the inorganic insulating layer 125 does not have the groove GR and has a continuous shape from the first area 1A to the second area 2A and the wire 215c is arranged on the inorganic insulating layer 125, high tension stress may be applied to the wire 215c in the bending process of the substrate 100, etc. Especially, since the hardness of the inorganic insulating layer 125 is greater than that of the organic material layer 160, there may be a high probability that cracks, etc., occur in the inorganic insulating layer 125 in the bending area BA. Furthermore, when a crack occurs in the inorganic insulating layer 125, there may also be a high probability that the crack, etc., occur in the wire 215c on the inorganic insulating layer 125, and defects such as broken wiring in the wire 215c may occur.

However, in the case of the display apparatus according to an embodiment as described above, the inorganic insulating layer 125 may include the groove GR in the bending area BA, and a portion of the wire 215c in the bending area BA may be arranged on the organic material layer 160, which fills at least a portion of the groove GR of the inorganic insulating layer 125. Since the inorganic insulating layer 125 includes the groove GR in the bending area BA, the probability that cracks, etc., occur in the inorganic insulating layer 125 may be significantly lower than in the case in which the inorganic insulating layer 125 does not have the groove GR. And in the case of the organic material layer 160, the probability of cracks occurring is low due to characteristics of organic materials. Thus, the occurrence of cracks, etc., in the wire 215c arranged on the organic material layer 160 in the bending area BA may be prevented, or the probability of cracks occurrence may be reduced. Since the hardness of the organic material layer 160 is less than that of the inorganic material layer, the organic material layer 160 may absorb the tension stress caused by bending of the substrate 100, etc., and thus, the concentration of the tension stress in the wire 215c may be effectively reduced.

The organic material layer 160 may be formed when organic material layers included in the display area DA are formed, with the same material thereof. For example, when the planarization layer 140 is formed with an organic material, the organic material layer 160 may be simultaneously formed with the same organic material. For another example, the organic material layer 160 may be simultaneously formed when the pixel definition layer 150 is formed, with the same material thereof. For another example, the organic material layer 160 may be simultaneously formed when the organic encapsulation layer 420 of the encapsulation layer 400 is formed, with the same material thereof.

In addition, when the interlayer insulating layer 130 is formed with a dielectric organic material, the organic material layer 160 may be simultaneously formed with the same dielectric organic material. In other words, various other modifications may be possible. In some cases, the organic material layer 160 may be formed in a separate process regardless of the planarization layer 140.

A structure in which the organic material layer 160 is simultaneously formed with organic material layers included in the display area DA, with the same material thereof, may be applicable to the above-described or to-be-described display apparatuses.

According to an embodiment, a display apparatus may include first and second conductive layers 213a and 213b connected to the wire 215c, in addition to the wire 215c. The first and second conductive layers 213a and 213b may be in the first area 1A or the second area 2A and on a layer different from the layer on which the wire 215c is arranged. FIG. 3 illustrates that the first and second conductive layers 213a and 213b include the same material as the gate electrode 213 of the TFT 210 and are on a same layer as the gate electrode 213, that is, on the gate insulating layer 120. In addition, it is illustrated that the wire 215c contacts the first and second conductive layers 213a and 213b via contact holes CNT1 and CNT2 formed in the interlayer insulating layer 130. It is also illustrated that the first conductive layer 213a is in the first area 1A and the second conductive layer 213b is in the second area 2A.

The first conductive layer 213a in the first area 1A may be electrically connected to the TFT, etc., in the display area DA, and accordingly, the wire 215c may be electrically connected to the TFT, etc., in the display area DA via the first conductive layer 213a. The second conductive layer 213b in the second area 2A may also be electrically connected to the TFT, etc. in the display area DA via the wire 215c. The first and second conductive layers 213a and 213b may be electrically connected to components in the display area DA, while being outside the display area DA. In addition, the first and second conductive layers 213a and 213b may extend in a direction of the display area DA, and at least a portion thereof may be in the display area DA, while being outside the display area DA.

As described above, the display apparatus is illustrated in an un-bent state in FIG. 3 for the sake of convenience; however, the display apparatus according to an embodiment is actually in a state in which the substrate 100, etc., are bent in the bending area BA, as illustrated in FIG. 1. In this structure, the substrate 100 of the display apparatus may be manufactured in approximately a flat state in a manufacturing process, as illustrated in FIG. 3, and thereafter, the display apparatus may be allowed to have a shape as approximately illustrated in FIG. 3 by bending the substrate 100, etc. in the bending area BA. In this case, components in the bending area BA may receive the tension stress in a process of bending the substrate 100, etc. in the bending area BA.

Accordingly, in the case of the wire 215c crossing the bending area BA, the occurrence of a crack in the wire 215c or defects such as broken wiring in the wire 215c may be prevented by including a material with a high elongation percentage. In addition, an efficiency of electrical signal transfer in the display apparatus may be enhanced, and an occurrence rate of defects in the manufacturing process may be reduced, by forming the first and second conductive layers 213a and 213b in the first area 1A or the second area 2A with materials that have elongation percentages lower than that of the wire 215c, while having electrical/physical characteristics different from those of the wire 215c. For example, the first and second conductive layers 213a and 213b may include Mo, while the wire 215c may include Al. In addition, either the wire 215c or the first and second conductive layers 213a and 213b may have a multi-layer structure, in some cases.

In the case of the second conductive layer 213b in the second area 2A, at least a portion of a top surface thereof may not be covered by the planarization layer 140, etc., but be exposed to the outside, unlike as illustrated in FIG. 3, and thus, may be electrically connected to various electronic devices, a PCB, etc.

A stress neutralization layer (SNL) 600 may be outside the display area DA. In other words, the SNL 600 may be on the wire 215c at least to correspond to the bending area BA.

When a laminated structure is bent, a stress neutral plane may exist inside the laminated structure. If the SNL 600 is omitted, an excessive tension stress, etc. may be applied to the wire 215c in the bending area BA due to the bending of the substrate 100, etc. The reason is that the location of the wire 215c may not correspond to that of the stress neutral plane. However, the location of the stress neutral plane may be adjusted in the laminated structure that includes all of the substrate 100, the wire 215c, the SNL 600, etc., by controlling the SNL 600 to exist and modifying a thickness and an elastic modulus, etc. thereof. Accordingly, the tension stress applied to the wire 215c may be reduced by arranging the stress neutral plane around the wire 215c via the SNL 600.

The SNL 600 may extend to ends of the edges of the substrate 100 of the display apparatus, unlike as illustrated in FIG. 3. For example, in the second area 2A, the wire 215c, the first and second conductive layers 213a and 213b and/or other conductive layers electrically connected thereto, etc., may, without having at least a portion thereof be covered by the interlayer insulating layer 130, the planarization layer 140, etc., be electrically connected to various electronic devices, printed circuit boards, etc. Accordingly, the wire 215c, the first and second conductive layers 213a and 213b and/or other conductive layers electrically connected thereto may have portions that are electrically connected to various electronic devices, printed circuit boards, etc., and each other. In this case, electrically connected portions may be protected from impurities, such as outside moisture, and the SNL 600 may serve as a protection layer by having such electrically connected portions covered by the SNL 600. For this purpose, the SNL 600 may extend, for example, to ends of the edges of the substrate 100 of the display apparatus.

The top surface of the SNL 600 in a direction of the display area DA (-x direction) is illustrated as to coincide with (i.e., be flush with) the top surface of the polarizing plate 520 (in +z direction) in FIG. 3. However, the embodiment is not limited thereto. For example, the edge of the SNL 600 in the direction of the display area DA (-x direction) may cover a portion of the top surface at the edge of the polarizing plate 520. Alternatively, the edge of the SNL 600 in the direction of the display area DA (-x direction) may not contact the polarizing plate 520 and/or the OCA 510. Especially, in the latter case, a movement of a gas, which may be generated in the SNL 600 during or after the forming of the SNL 600 in the direction of the display area DA (-x direction), may be prevented from causing a deterioration of the display devices such as the OLED and etc.

When the top surface of the SNL 600 in the direction of the display area DA (-x direction) coincides with the top surface of the polarizing plate 520 (+z direction) as illustrated in FIG. 3, or the edge of the SNL 600 covers a portion of the top surface at the edge of the polarizing plate 520, or the edge of the SNL 600 in the direction of the display area DA (-x direction) contacts the OCA 510, a thickness of the portion of the SNL 600 in the direction of the display area DA (-x direction) may be greater than that of the other portion of the SNL 600. At the time of forming of the SNL 600, a material in a liquid or paste type may be doped and hardened. A volume of the SNL 600 may be reduced in a hardening process. In this case, when the portion of the SNL 600 in the direction of the display area DA (-x direction) contacts the polarizing plate 520 and/or the OCA 510, the location of the corresponding portion of the SNL 600 may become fixed, and thus, a volume reduction may occur in the remaining portion of the SNL 600. As a result, the thickness of the portion of the SNL 600 in the direction of the display area DA (-x direction) may be greater than that of the other portion of the SNL 600.

In addition, the display apparatus according to an embodiment may include a touch electrode (not shown) with various patterns for a touch screen function arranged on the encapsulation layer 400, and a touch protection layer for covering and protecting the touch electrode. In addition, the display apparatus may further include a protecting film (not shown) for protecting the bottom surface (-z direction) of the substrate 100. In this case, the protecting film may include openings corresponding to the bending area BA.

Figure 5:
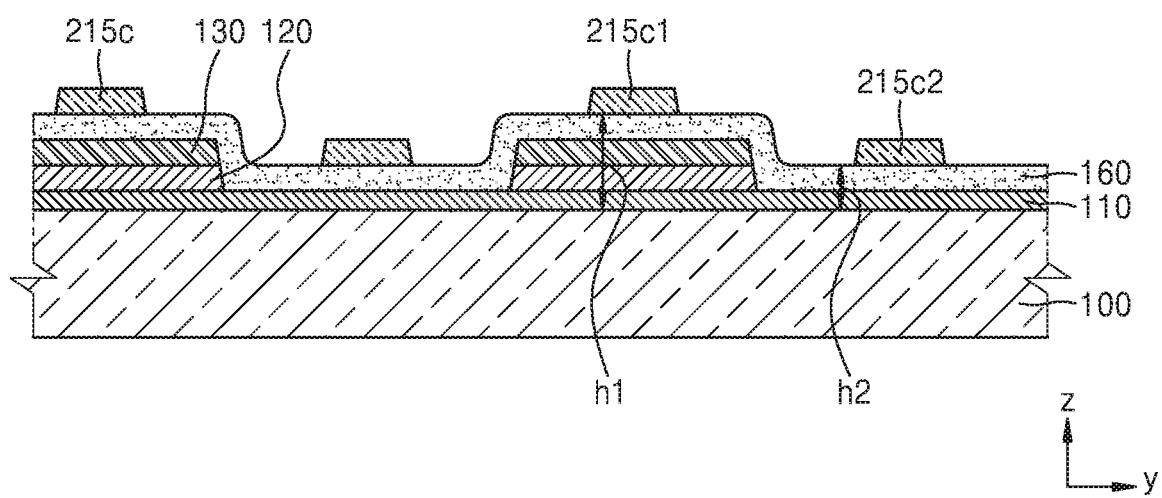
FIG. 5 is a portion of a cross-sectional view of FIG. 4, taken along a line II-II'.

FIG. 4 is an enlarged plan view of a section of I in FIG. 2. FIG. 5 is a portion of a cross-sectional view of FIG. 4, taken along a line Referring to FIG. 4, when viewed from above, a portion of edges of the groove in the inorganic insulating layer 125 may appear to include an uneven pattern in the first direction (+y direction). The uneven pattern may include a convex part 125a that protrudes from one side wall of the groove GR in the second direction (+x direction) or in a direction (-x direction) opposite to the second direction and a concave part 125b that sinks in with respect to the convex part 125a. As illustrated in FIG. 4, the uneven pattern may include the convex part 125a and the concave part 125b arranged in a regular alternating order. However, the embodiment is not limited thereto. The uneven pattern may have various other modifications such that the convex part 125a and the concave part 125b are irregularly arranged.

The organic material layer 160 may be arranged, while filling the groove of the inorganic insulating layer 125 and covering the side wall of the groove. In this case, the uneven pattern may increase a contact area between the organic material layer 160 and the inorganic insulating layer 125 to enhance an adhesion force between the organic material layer 160 and the inorganic insulating layer 125.

As described above, since wires 215c1, 215c2 and 215c of the wiring unit 40 may be simultaneously formed with the source electrode 215a and the drain electrode 215b, with the same material thereof, the source electrode 215a, the drain electrode 215b, and wires 215c1, 215c2 and 215c may be formed after a conductive material layer is formed on the entire surface of the substrate 100 and subsequently patterned. In this case, when a step exists or a slope is not gentle at a boundary area in which a top surface of the inorganic insulating layer 125 and a top surface of the organic material layer 160 meet each other, the conductive material may not be removed from the boundary area but remain in corresponding areas in a process of patterning conductive material layers. Then, remaining conductive materials may cause a short between wires. The above-described short may be prevented by securing a distance between wires 215c1, 215c2 and 215c in the boundary area in which the top surface of the inorganic insulating layer 125 and the top surface of the organic material layer 160 meet each other.

In another embodiment, the wiring unit 40 may include the first and second wires 215c1 and 215c2, which are adjacent to each other, and a first width W1 in which the groove overlaps the first wire 215c1 may be different from a second width W2 in which the groove overlaps the second wire 215c2. Alternatively, in an embodiment, the first wire 215c1 may pass through the convex part 125a, and the second wire 215c2 may pass through the concave part 125b adjacent to the convex part 125a.

Accordingly, gaps may occur between the first wiring 215c1 and the second wiring 215c2 in not only the first direction (+y direction) but also the third direction (+z direction), as illustrated in FIG. 5. In other words, distances between wires 215c1, 215c2 and 215c3 may be longer in the boundary area in which the top surface of the inorganic insulating layer 125 and the top surface of the organic material layer 160 meet each other.

Referring to FIG. 5, a first height h1, which is from the top surface of the substrate 100 to a portion of the first wire 215c1 on the organic material layer 160, may be different from a second height h2, which is from the top surface of the substrate 100 to a portion of the second wire 215c2. In other words, since the buffer layer 110, the gate insulating layer 120, the interlayer insulating layer 130, and the organic material layer 160 are sequentially laminated below the portion of the first wire 215c1, while only the buffer layer 110 and the organic material layer 160 are sequentially laminated below the second wire 215c2, a difference in the heights of the first wire 215c1 and the second wire 215c2 may occur.

FIGS. 6A through 6G are plan views of portions of a display apparatus according to various embodiments. In detail, FIGS. 6A through 6G are plan views of portions corresponding to a section I in FIG. 2. In addition, FIG. 6AA is a cross-sectional view of FIG. 6A, taken along a line and FIG. 6BB is a cross-sectional view of FIG. 6B, taken along a line IV-IV'.

Figure 6A:
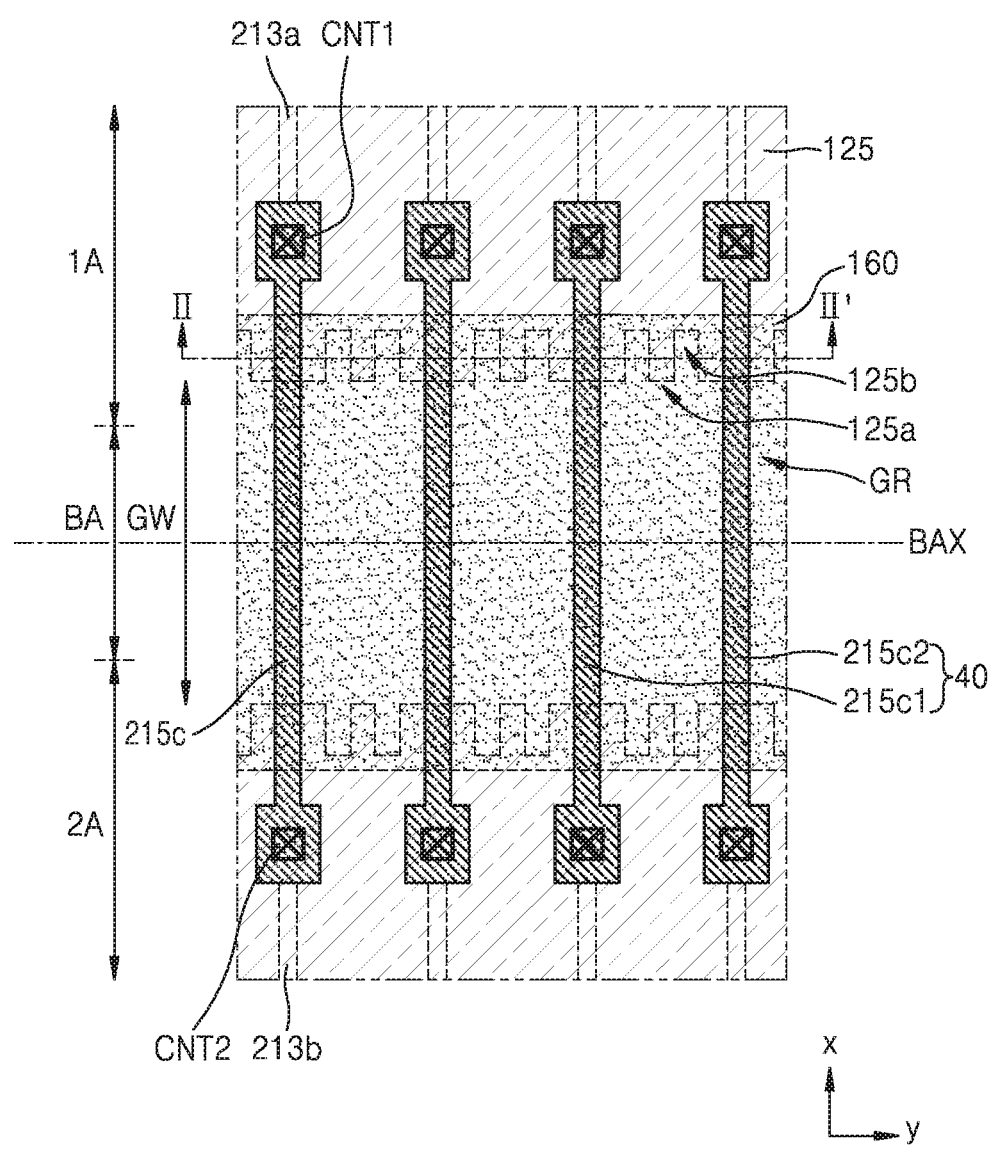
FIG. 6A is a plan view of a portion of a display apparatus according to another embodiment.
Figure 6A:
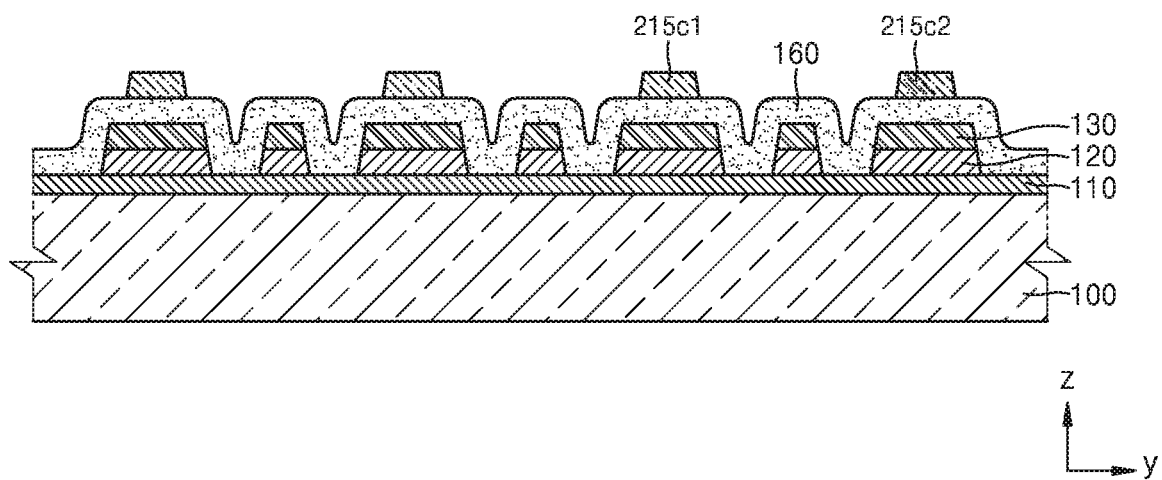

Referring to FIG. 6A, when viewed from above, a portion of edges of the groove GR of the inorganic insulating layer 125 may appear to include the uneven pattern in the first direction (+y direction), and the uneven pattern may include the convex part 125a and the concave part 125b. The wiring unit 40 may include the first wire 215c1 and the second wire 215c2, which are adjacent to each other, and a plurality of convex parts 125a and concave parts 125b may be between the first wire 215c1 and the second wire 215c2.

When convex parts 125a and/or concave parts 125b of the uneven pattern are densely placed, the adhesion force between the organic material layer 160 and the inorganic insulating layer 125 may be strengthened.

Referring to FIG. 6AA, which is a cross-sectional view of FIG. 6A, taken along the line both the first wire 215c1 and the second wire 215c2 may be arranged at a same height from the top surface of the substrate 100 according to an embodiment. Since a portion of the gate insulating layer 120 and the interlayer insulating layer 130 is removed between the first wire 215c1 and the second wire 215c2, and the organic material layer 160 fills the removed portion, the adhesion force between the organic material layer 160 and the inorganic insulating layer refer to 125 of FIG. 6A may be improved.

Figure 6B:
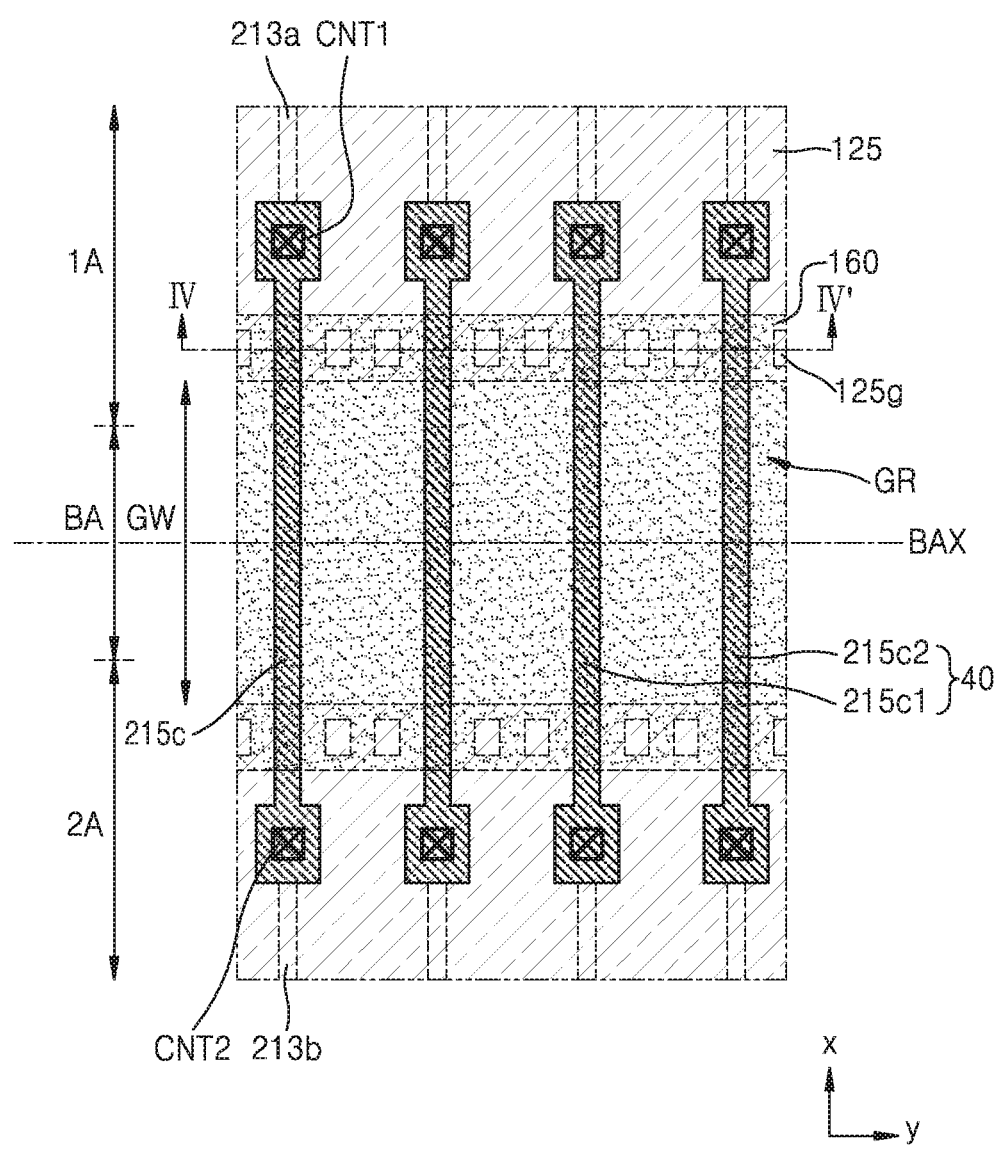
FIG. 6B is a plan view of a portion of a display apparatus according to another embodiment.
Figure 6B:
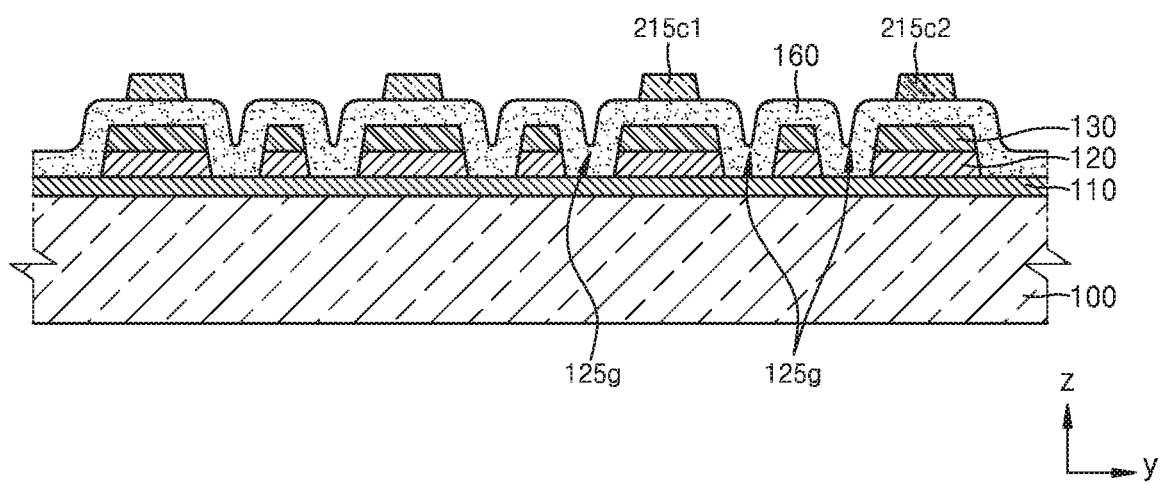

Referring to FIG. 6B, the inorganic insulating layer 125 may further include the groove GR formed by removing a portion thereof and may further include an additional opening or additional groove 125g, which has an area smaller than that of the groove GR, around the groove GR. The additional opening or additional groove 125g may include a hole penetrating the inorganic insulating layer 125 or have a groove shape in which a portion of the inorganic insulating layer 125 is removed.

According to an embodiment, a plurality of additional openings or additional grooves 125g may be between the first wire 215c1 and the second wire 215c2, which are adjacent to each other. FIG. 6B illustrates that the additional opening or groove 125g is arranged in all of the first area 1A and the second area 2A. However, the embodiment is not limited thereto. Various other modifications may be possible such that the additional opening or additional groove 125g may be arranged only in the first area 1A or only in the second area 2A.

The additional opening or additional groove 125g may be filled by the organic material layer 160. In addition, the organic material layer 160 may extend to the top surface of the inorganic insulating layer 125 while filling the groove GR and the additional opening or additional groove 125g. Accordingly, the adhesion force between the organic material layer 160 and the inorganic insulating layer 125 may be strengthened.

In FIG. 6B, one side wall of the groove GR may additionally include the above-described uneven pattern.

Referring to FIG. 6BB, which is a cross-sectional view of FIG. 6B, taken along the line IV-IV', the first wire 215c1 and the second wire 215c2 may be arranged at a same height from the top surface of the substrate 100 according to the present embodiment. Since the additional groove 125g is between the first wire 215c1 and the second wire 215c2, and the organic material layer 120 fills the first wire 215c1 and the second wire 215c2, the adhesion force between the organic material layer 160 and the inorganic insulating layer 125 may be strengthened.

Figure 6C:
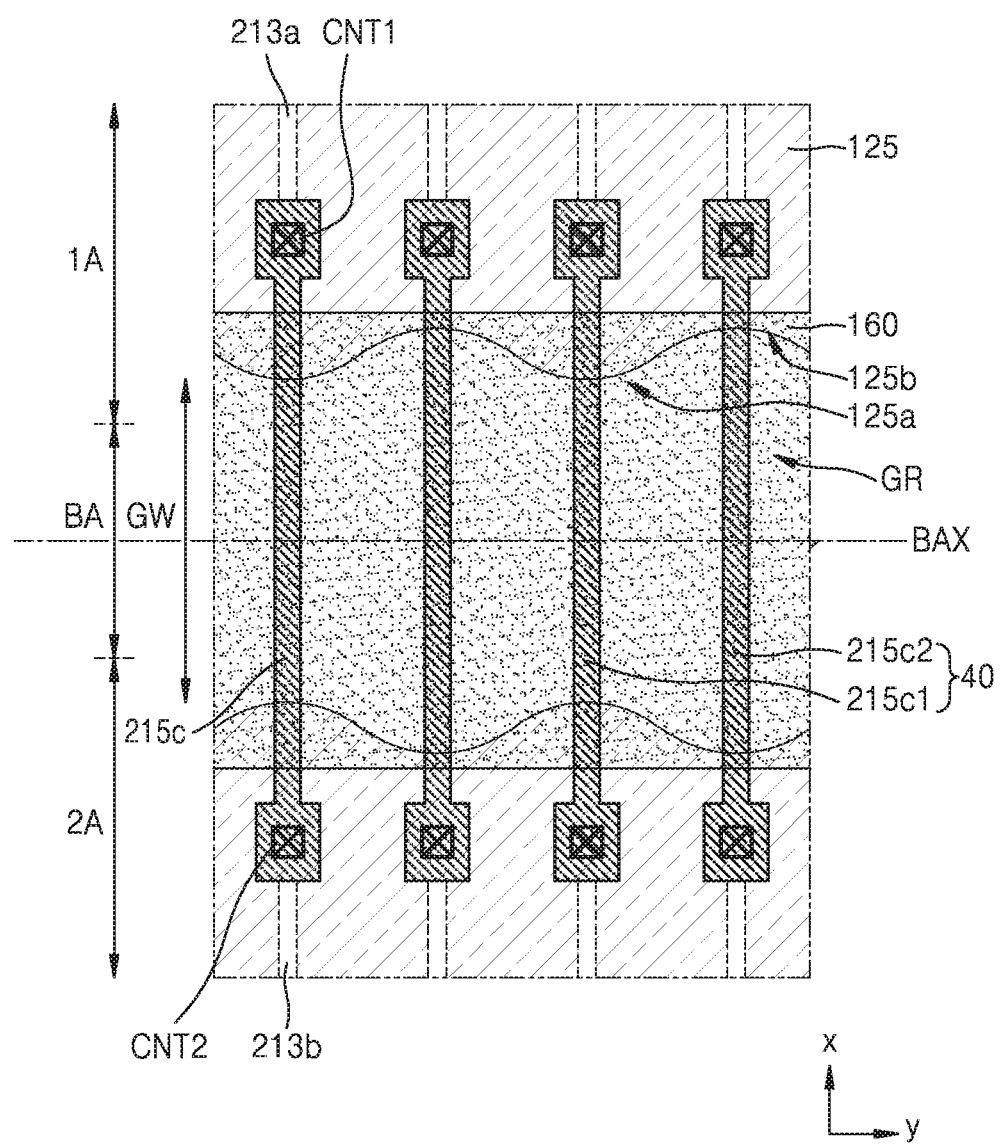
FIG. 6C is a plan view of a portion of a display apparatus according to another embodiment.
Figure 6D:
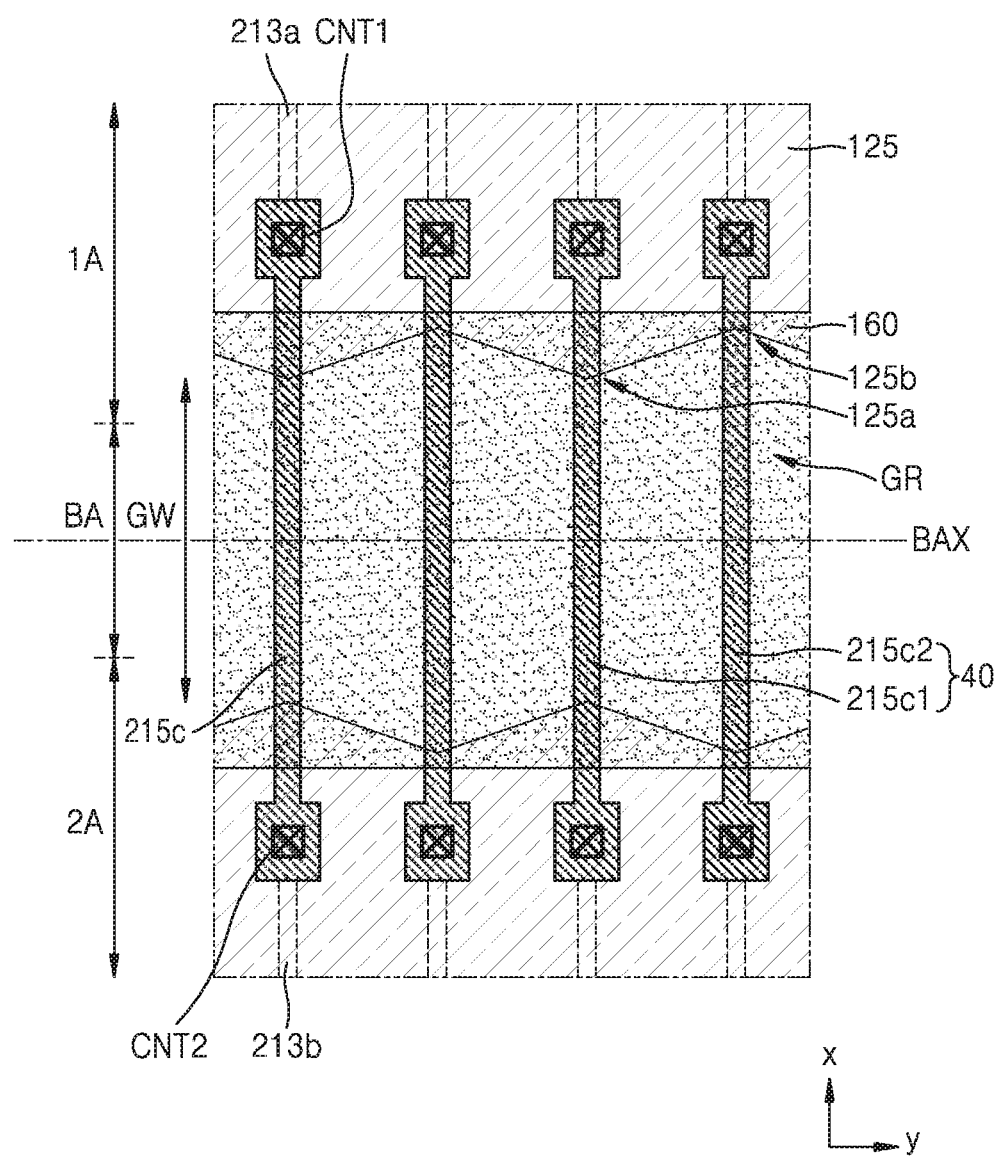
FIG. 6D is a plan view of a portion of a display apparatus according to another embodiment.

According to various embodiments, the uneven pattern may have various shapes. For example, the uneven pattern may have a winding curve shape as illustrated in FIG. 6C, or a zigzag pattern as illustrated in FIG. 6D. In addition, the uneven pattern may have various other modifications in sizes and gaps of the convex part 125a and the concave part 125b.

Figure 6E:
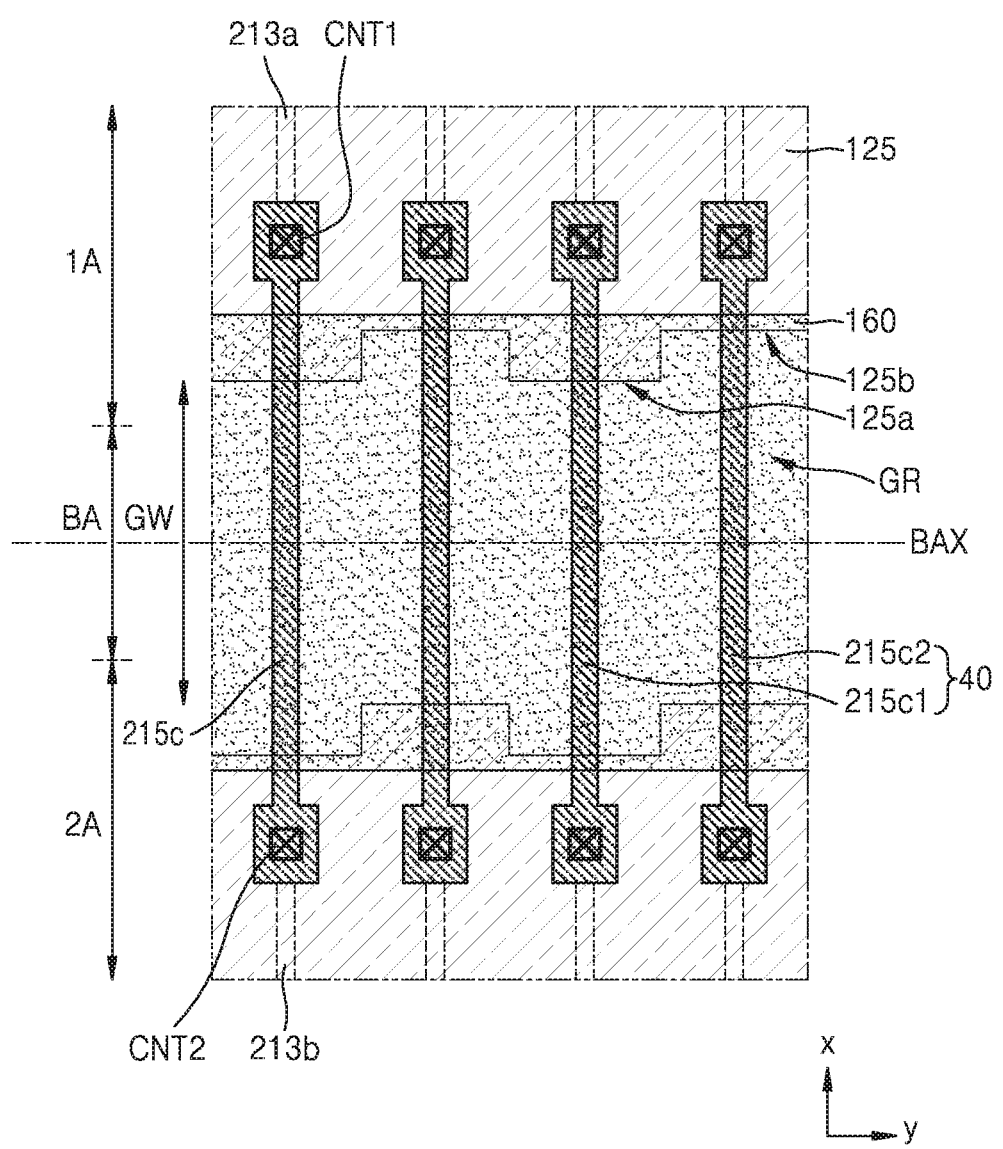
FIG. 6E is a plan view of a portion of a display apparatus according to another embodiment.
Figure 6F:
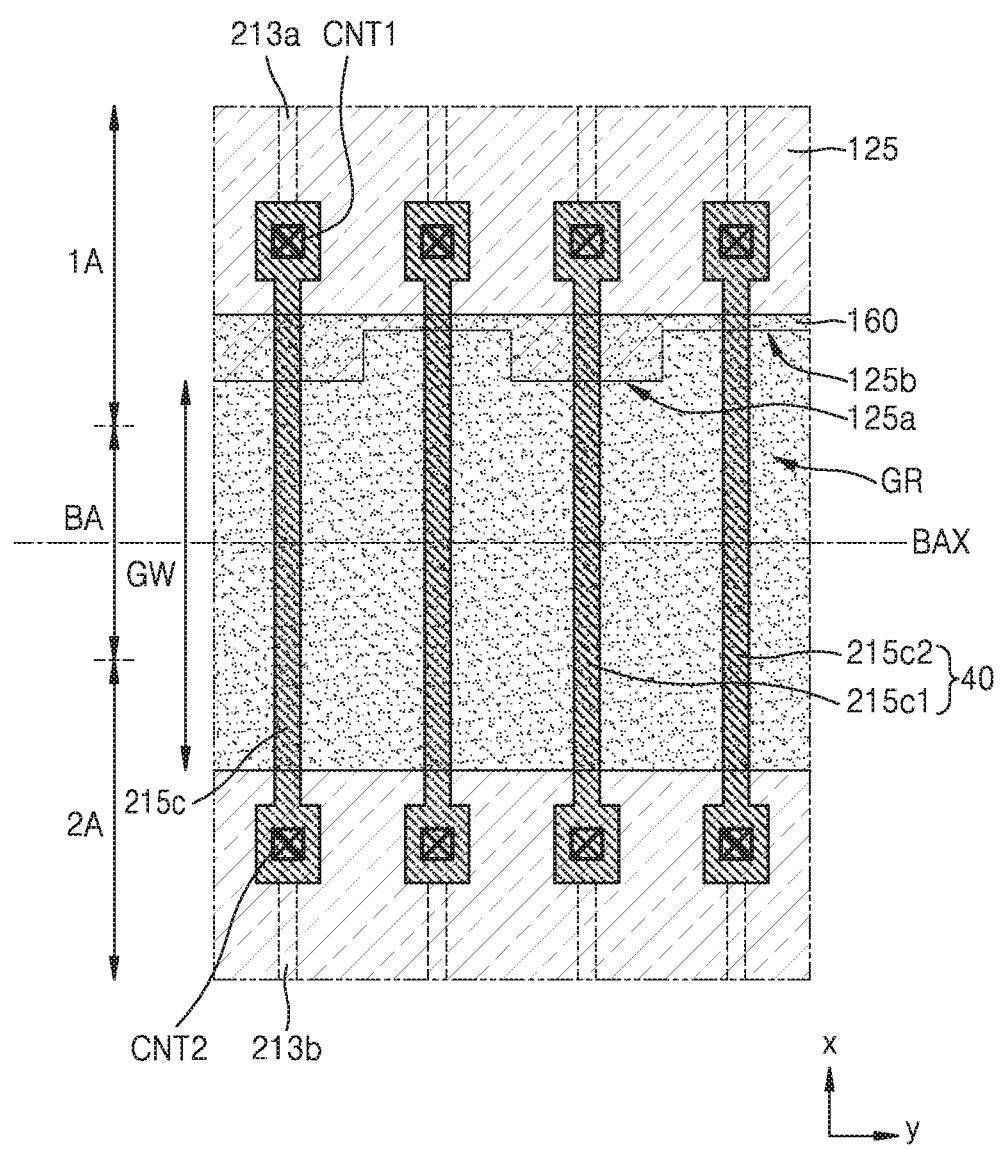
FIG. 6F is a plan view of a portion of a display apparatus according to another embodiment.

So far, the uneven pattern arranged on side walls of the inorganic insulating layer 125 is illustrated as being symmetrical with the bending axis BAX as the center. However, the embodiment is not limited thereto. As illustrated in FIG. 6E, the uneven pattern may not be symmetrical with the bending axis BAX as the center, and uneven patterns on side walls in the first area 1A and the second area 2A may be different from each other. In addition, as illustrated in FIG. 6F, the uneven pattern may be arranged only on one side wall and may not be arranged on the other opposite side wall.

Figure 6G:
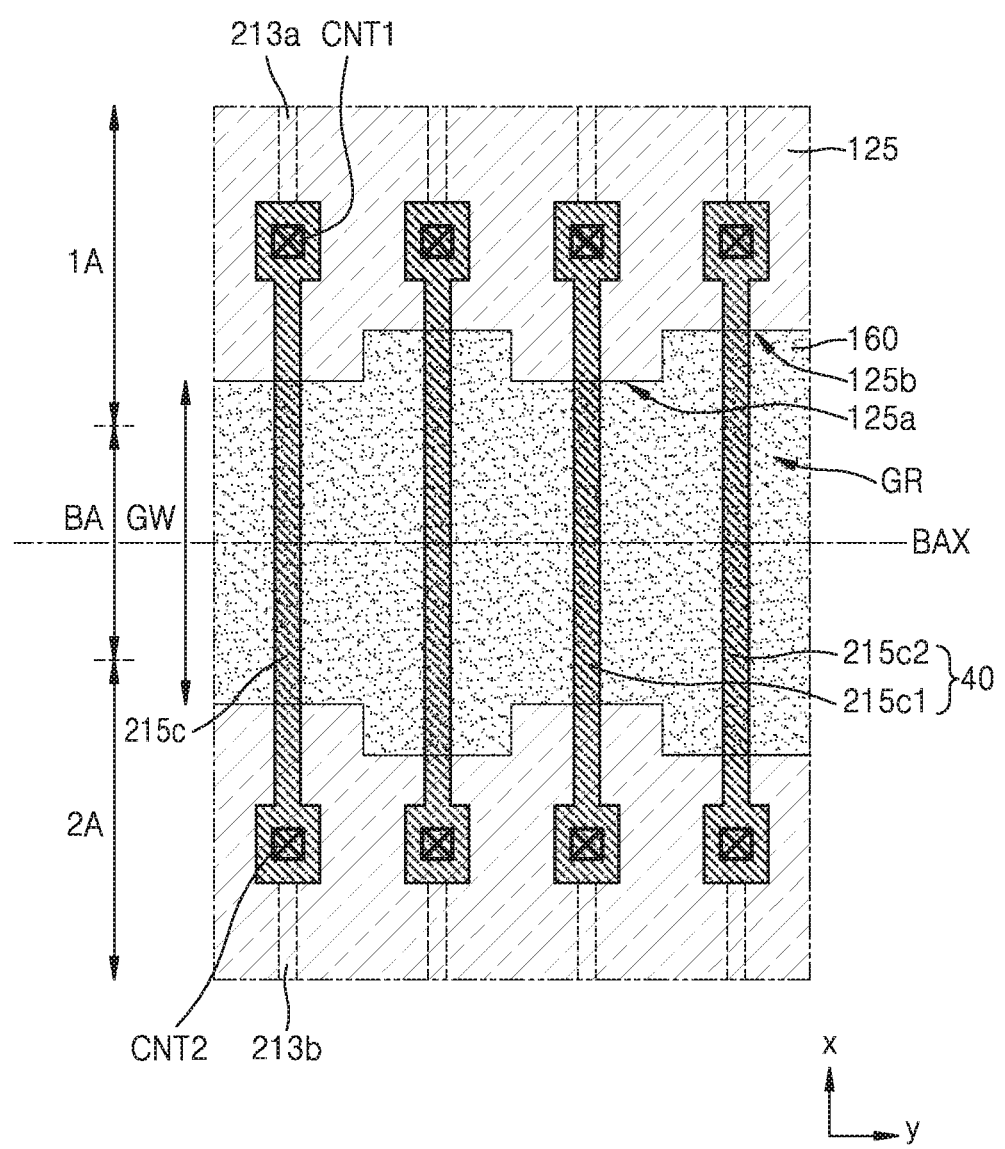
FIG. 6G is a plan view of a portion of a display apparatus according to another embodiment.

Referring to FIG. 6G, the organic material layer 160 may include a shape corresponding to the uneven pattern arranged on side walls of the groove GR of the inorganic insulating layer 125. In this case, the organic material layer 160 may not be on the top surface of the convex part 125a of the uneven pattern, and accordingly, an occurrence of steps due to the organic material layer 160 may be reduced. Thus, an occurrence of defects may be reduced in a process of patterning the first through third wires 215c1, 215c2, and 215c3.

Figure 7A:
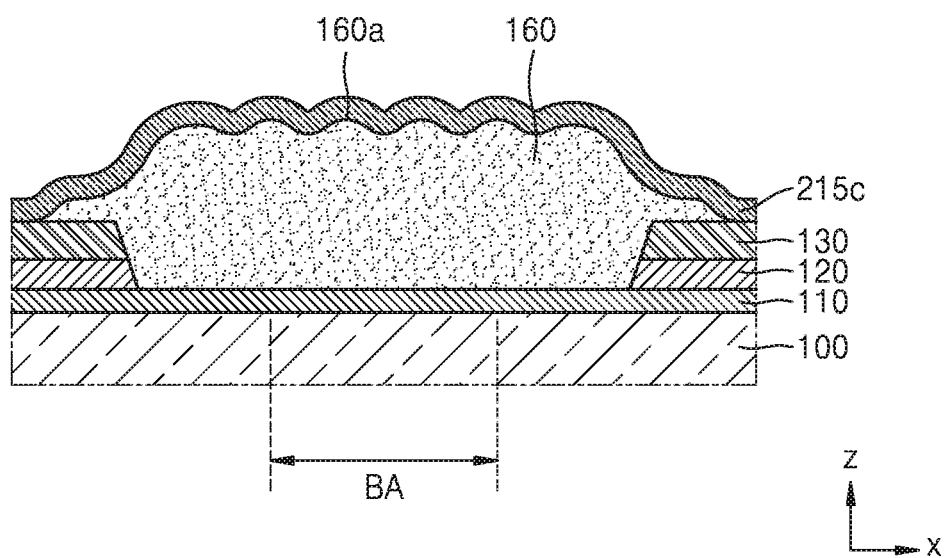
FIG. 7A is a cross-sectional view of a portion of a display apparatus according to another embodiment.
Figure 7B:
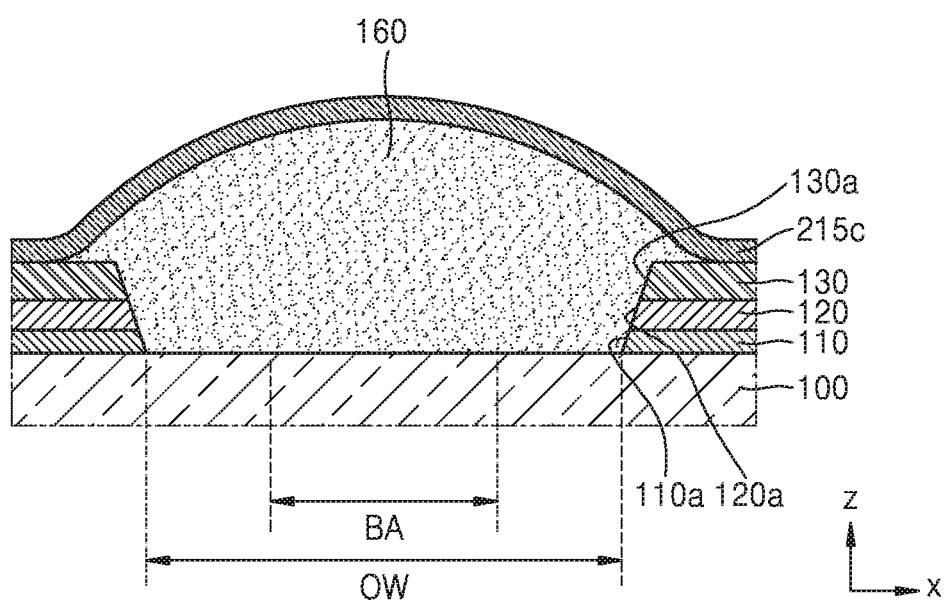
FIG. 7B is a cross-sectional view of a portion of a display apparatus according to another embodiment.

FIGS. 7A and 7B are cross-sectional views of portions of a display apparatus according to another embodiment. In particular, FIGS. 7A and 7B are cross-sectional views illustrating the neighborhood of the bending area BA.

Referring to FIG. 7A, at least a portion of the top surface (in +z direction) of the organic material layer 160 that is arranged in the groove GR of the inorganic insulating layer 125 may include a concavo-convex surface. Accordingly, a surface area of the top surface of the organic material layer 160 and the surface area of top and lower surfaces of the wire 215c in the groove GR may increase. A larger surface area of the top surface of the organic material layer 160 and the top and lower surfaces of the wire 215c may denote more room for a shape change to reduce tensile stress due to bending of the substrate 100, etc.

For reference, since the wire 215c is on the organic material layer 160, the lower surface of the wire 215c may have a shape corresponding to a concavo-convex surface 160a of the organic material layer 160.

According to another embodiment, when the first organic material layer 160 is formed, particular portions may be relatively more etched (removed) than other portions, by using the photoresist material and varying the exposure amount via the slit mask or the half-tone mask on various portions of the top surface of the first organic material layer 160, which are still in a generally smooth state. In this case, more etched portions may be referred to as concave portions on the top surface of the first organic material layer 160. However, the manufacturing method of the display apparatus according to an embodiment is not limited thereto. For example, various other methods may be used such that only the particular portions are removed via a dry-etching, etc., after the top surface of the organic material layer 160, which is in the generally smooth state, is formed.

Referring to FIG. 7B, the inorganic insulating layer 125 may have an opening corresponding to the bending area BA. Here, the opening of the inorganic insulating layer 125 may be referred to as an area in which a layer arranged at the bottom of the inorganic insulating layer 125 is exposed. In other words, the buffer layer 110, the gate insulating layer 120, and the interlayer insulating layer 130 may respectively have openings 110a, 120a, and 130a corresponding to the bending area BA. That the above-described openings correspond to the bending area BA may be referred to as the openings overlapping the bending area BA. In this case, an area of the opening may be larger than that of the bending area BA. To show this effect, a width of the opening OW is illustrated as greater than the width of the bending area BA. The area of the opening may be defined as the area of the opening with the smallest area among the openings 110a, 120a, and 130a of the buffer layer 110, the gate insulating layer 120, and the interlayer insulating layer 130. FIG. 3 illustrates that the area of the opening is defined as the area of the opening 110a of the buffer layer 110.

Since a hardness of the inorganic insulating layer 125 is higher than that of the organic material layer 160, a probability of crack occurrence in the inorganic insulating layer 125 in the bending area BA may be very high. When a crack occurs in the inorganic insulating layer 125, a probability that the crack propagates to the wire 215c may be high. However, the probability of the crack occurrence in the inorganic insulating layer 125 may be reduced by forming the groove GR in the inorganic insulating layer 125. In addition, the probability of the crack occurrence in the inorganic insulating layer 125 may be further reduced by forming the opening 110a in the buffer layer 110 in the bending area BA.

So far, various embodiments have been described that can be applied to the embodiment of the present disclosure. Such embodiments may be implemented as separate embodiments, or as an embodiment in combination with each other. For example, various combinations may be possible such that embodiments in which the uneven pattern is used to the side walls of the inorganic insulating layer 125 illustrated in FIGS. 6A through 6G may be applied to an embodiment in which the opening is formed in the inorganic insulating layer 125 illustrated in FIG. 7B.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
    a substrate comprising a bending area between a first area and a second area;
    an inorganic insulating layer arranged over the substrate, the inorganic insulating layer having an opening or a groove corresponding to the bending area;
    a wiring unit extending to the second area through the bending area, the wiring unit arranged on the inorganic insulating layer and at least a portion thereof overlapping the opening or the groove; and
    an organic material layer between the inorganic insulating layer and the wiring unit, the organic material layer configured to fill the opening or the groove,
    wherein the wiring unit comprises a first wire and a second wire that are adjacent to each other, and a smallest width in which the opening or the groove overlaps the first wire is different from a smallest width in which the opening or the groove overlaps the second wire.

2. The display apparatus of claim 1, wherein a portion of edges of the opening or the groove, when viewed from above, appears to have an uneven pattern.

3. The display apparatus of claim 2, wherein the uneven pattern has a convex part and a concave part arranged in a regular alternating order, the first wire passes through the convex part, and the second wire passes through the concave part adjacent to the convex part.

4. The display apparatus of claim 2, wherein the organic material layer appears to have a shape corresponding to the uneven pattern, when viewed from above.

5. The display apparatus of claim 1, wherein the inorganic insulating layer further comprises an additional opening or additional groove, around the opening or the groove, having a smaller area than the opening or the groove.

6. The display apparatus of claim 5, wherein the additional opening or additional groove is arranged in at least one of the first area and the second area.

7. The display apparatus of claim 1, wherein an area of the opening or groove is larger than that of the bending area.

8. The display apparatus of claim 1, wherein the organic material layer covers an inner surface of the opening or the groove and extends to a top surface of the inorganic insulating layer.

9. The display apparatus of claim 1, the organic material layer comprises a concavo-convex surface on at least a portion of a top surface thereof.

10. A display apparatus comprising:
    a substrate comprising a bending area between a first area and a second area;
    an inorganic insulating layer arranged over the substrate, the inorganic insulating layer having an opening or a groove corresponding to the bending area;
    a wiring unit extending to the second area through the bending area, the wiring unit arranged on the inorganic insulating layer and at least a portion thereof overlapping the opening or the groove; and
    an organic material layer positioned between the inorganic insulating layer and the wiring unit, the organic material layer configured to fill the opening or the groove,
    wherein a first face of the substrate is opposite a second face of the substrate and is positioned between the wiring unit and the second face of the substrate in a first direction, wherein the wiring unit comprises a first wire and a second wire that are adjacent to each other, wherein a smallest distance in the first direction to a portion of the first wire directly on the organic material layer from the first face of the substrate is unequal to a smallest distance in the first direction to a portion of the second wire directly on the organic material layer from the first face of the substrate, and wherein a minimum distance from the portion of the first wire to an edge of the organic material layer in a plan view of the display apparatus is equal to a minimum distance from the portion of the second wire to the edge of the organic material layer in the plan view of the display apparatus.

11. The display apparatus of claim 10, wherein
the inorganic insulating layer comprises a buffer layer, a gate insulating layer, and an interlayer insulating layer,
the buffer layer, the gate insulating layer, the interlayer insulating layer, and an organic material layer are sequentially laminated under a portion of the first wire, and
the buffer layer and the organic material layer are sequentially laminated under a portion of the second wire.

12. The display apparatus of claim 10, wherein portions of the first and second wires are arranged in a boundary area in which a top surface of the inorganic insulating layer and a top surface of the organic material layer meet each other.

13. The display apparatus of claim 10, further comprising a thin film transistor arranged in the first or second area and including a source electrode, a drain electrode, and a gate electrode,
wherein the first and second wires comprise a same material as that of the source electrode and the drain electrode.

14. The display apparatus of claim 10, further comprising a stress neutralization layer above the wiring unit.

\* \* \* \* \*